(12) United States Patent
Mitsuhashi et al.

(10) Patent No.: US 6,667,246 B2
(45) Date of Patent: Dec. 23, 2003

(54) WET-ETCHING METHOD AND METHOD FOR MANUFACTURING SEMICONDUCTOR DEVICE

(75) Inventors: Riichiro Mitsuhashi, Ibaragi (JP); Masafumi Kubota, Osaka (JP); Shigenori Hayashi, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/309,038

(22) Filed: Dec. 4, 2002

(65) Prior Publication Data

US 2003/0104706 A1 Jun. 5, 2003

(30) Foreign Application Priority Data

Dec. 4, 2001 (JP) .......................... 2001-369825

(51) Int. Cl.⁷ .................. H01L 21/31; H01L 21/461
(52) U.S. Cl. ................. 438/756; 438/758; 438/769; 438/778; 438/784; 438/785
(58) Field of Search .................. 438/287, 758, 438/769, 770, 775, 785, 591, 778, 784, 756; 257/295, 310, 311, 410

(56) References Cited

U.S. PATENT DOCUMENTS

| 5,719,416 A | * | 2/1998 | Yoshimori et al. | 257/295 |
|---|---|---|---|---|
| 6,207,589 B1 | * | 3/2001 | Ma et al. | 438/785 |
| 6,265,297 B1 | * | 7/2001 | Powell | 438/592 |
| 6,297,539 B1 | * | 10/2001 | Ma et al. | 257/410 |
| 6,444,592 B1 | * | 9/2002 | Ballantine et al. | 438/770 |
| 6,485,988 B2 | * | 11/2002 | Ma et al. | 438/3 |
| 6,528,328 B1 | * | 3/2003 | Aggarwal et al. | 438/3 |
| 6,528,374 B2 | * | 3/2003 | Bojarczuk, Jr. et al. | 438/299 |
| 6,576,967 B1 | * | 6/2003 | Schaeffer, III et al. | 257/411 |

FOREIGN PATENT DOCUMENTS

| JP | 2002-75972 A | 3/2002 |
|---|---|---|
| JP | 2002-174908 A | 6/2002 |

OTHER PUBLICATIONS

J.J. Chambers et al. "Effect of Composition and Post–Deposition Annealing on the Etch Rate of Hafnium and Zirconium Silicates in Dilute HF", Texas Instruments Incorporated Sep. 2001.

* cited by examiner

*Primary Examiner*—Michael S. Lebentritt
(74) *Attorney, Agent, or Firm*—McDermott, Will & Emery (57) ABSTRACT

A substrate with a metal oxide film deposited thereon is annealed, and then the surface of the metal oxide film is exposed to a plasma, after which the metal oxide film is removed by wet-etching.

10 Claims, 8 Drawing Sheets

FIG. 1

| Chemical | Concentration (%) | Time(min) | Δ (Å) | Remarks |
|---|---|---|---|---|
| KOH | 2 (wt. %) | 3 | -2 | |
| HCL | 3.5 | 3 | 6 | |
| HF | 50 | 1 | 4 | |
| HF | 10 | 3 | 0 | Peeling |
| AF | 4 | 3 | 0 | |
| HF | 1.2 | 3 | -4 | |
| HF | 1.2 | 3 | 0 | |
| HF | 10 | 0.5 | 3 | |
| HF | 10 | 1 | 10 | |
| HF | 5 | 1 | -4 | |
| HF | 5 | 2 | 231 | Peeling |
| HF+NH4OH | 1 | 1 | -1 | (Stock:HF 1%50ml+NH3 10%1ml) |
| HF+NH4OH | 1 | 1 | 0 | (Stock:HF 1%50ml+NH3 10%2ml) |
| HF+NH4OH | 1 | 1 | 0 | (Stock:HF 1%50ml+NH3 10%3ml) |
| HF+NH4OH | 1 | 1 | -5 | (Stock:HF 1%50ml+NH3 10%10ml) |
| H2SO4 | 10 | 1 | 1 | |
| H2SO4 | 10 | 3 | 0 | |
| HCl | 10 | 1 | -3 | |
| HCl | 10 | 3 | -4 | |
| HNO3 | 10 | 3 | 4 | |
| HNO3 | 10 | 1 | -5 | |
| H3PO4 | 10 | 1 | 1 | |
| H3PO4 | 10 | 3 | -1 | |
| HPS | 10 | 3 | 1 | |
| HPS+HF | 10+10 | 1.5 | 0 | Peeling |
| HPS+HF | 3+1 | 1 | 6 | (H2O2 3%50ml+HF 1%50ml) |
| HPS+HF | 3+1 | 3 | 10 | (H2O2 3%50ml+HF 1%50ml) |
| CH3COOH | Stock | 1 | 4 | |
| CH3COOH | Stock | 3 | 1 | |
| N2H4 | 40 | 1 | -2 | |
| N2H4 | 40 | 3 | 1 | |
| PS etching liquid | Stock | 1 | -15 | (HNO3:CH3COOH:HF=200:80:3) |
| PS etching liquid | Stock | 3 | -117 | Peeling (HNO3:CH3COOH:HF=200:80:3) |
| NH3 | 30 | 1 | 7 | |
| NH3 | 30 | 3 | 4 | |
| HF+HPS | 2+3 | 3 | -2 | |
| HF+HPS | 2+3 | 6 | 1 | |

FIG. 2

| | Plasma gas species | |
|---|---|---|
| | HBr+Cl$_2$+O$_2$ | HBr+Cl$_2$ |
| Plasma treatment time [min] | Wet-etched amount [Å] | Wet-etched amount [Å] |
| 1.0 | | 9.5 |
| 2.0 | 17.5 | 21.7 |
| 4.0 | 13.6 | 18.3 |
| 5 or more | | 28.1 |

WET-ETCHING METHOD AND METHOD FOR MANUFACTURING SEMICONDUCTOR DEVICE

BACKGROUND OF THE INVENTION

The present invention relates to a method for manufacturing a semiconductor device, and more particularly to a method for wet-etching a metal oxide film to be a gate insulating film having a high dielectric constant.

A silicon oxide film ($SiO_2$ film) has been used as a gate insulating film of an MIS semiconductor device. On the other hand, the degree of integration of semiconductor integrated circuits has been increased significantly in recent years. When a super thin silicon oxide film having a thickness of about 2 nm or less is used as a gate insulating film, the gate-leak characteristics deteriorate due to a direct-tunneling effect, etc., whereby it is difficult to realize an LSI having a low power consumption.

A high dielectric constant (i.e., high-k) metal oxide film made of an oxide of a metal such as hafnium is expected as a next-generation gate insulating film that replaces a silicon oxide film. For example, when a metal oxide film of hafnium ($HfO_2$ film), having a relative dielectric constant of about 20, is used as a gate insulating film, an $HfO_2$ film can have a capacitance equal to or greater than that of an $SiO_2$ film even if the $SiO_2$-equivalent thickness of the $HfD_2$ film is 2 nm or less. Moreover, by using an $HfO_2$ film as a gate insulating film, it is possible to realize a transistor in which the leakage current is reduced by three orders of magnitude or more from that when an $SiO_2$ film is used.

An $HfO_2$ film is normally deposited by using a sputtering method, a CVD (chemical vapor deposition) method, or the like. An $HfD_2$ film immediately after deposition (i.e., an as-deposited $HfO_2$ film) is easily dissolved by a dilute hydrogen fluoride (DHF) solution. Therefore, a DHF solution can be used as an etching liquid (hereinafter referred to also as "chemical solution") for wet-etching an $HfO_2$ film. However, when a deposited $HfO_2$ film is annealed, the solubility of the $HfO_2$ film to a DHF solution decreases (J. J. Chambers, et al., Effect of Composition and Post-Deposition Annealing on the Etch Rate of Hafnium and Zirconium Silicates in Dilute HF, The Electrochemical Society 200th Meeting, San Francisco, U.S.A., September 2001, abs. #1434). It is believed that this is due to the alteration of the surface of the $HfO_2$ film through the post-deposition annealing process.

However, in many cases where an $HfO_2$ film is to be used as a gate insulating film, one may desire to remove the $HfO_2$ film by wet-etching after the post-deposition annealing process.

Figure 1:
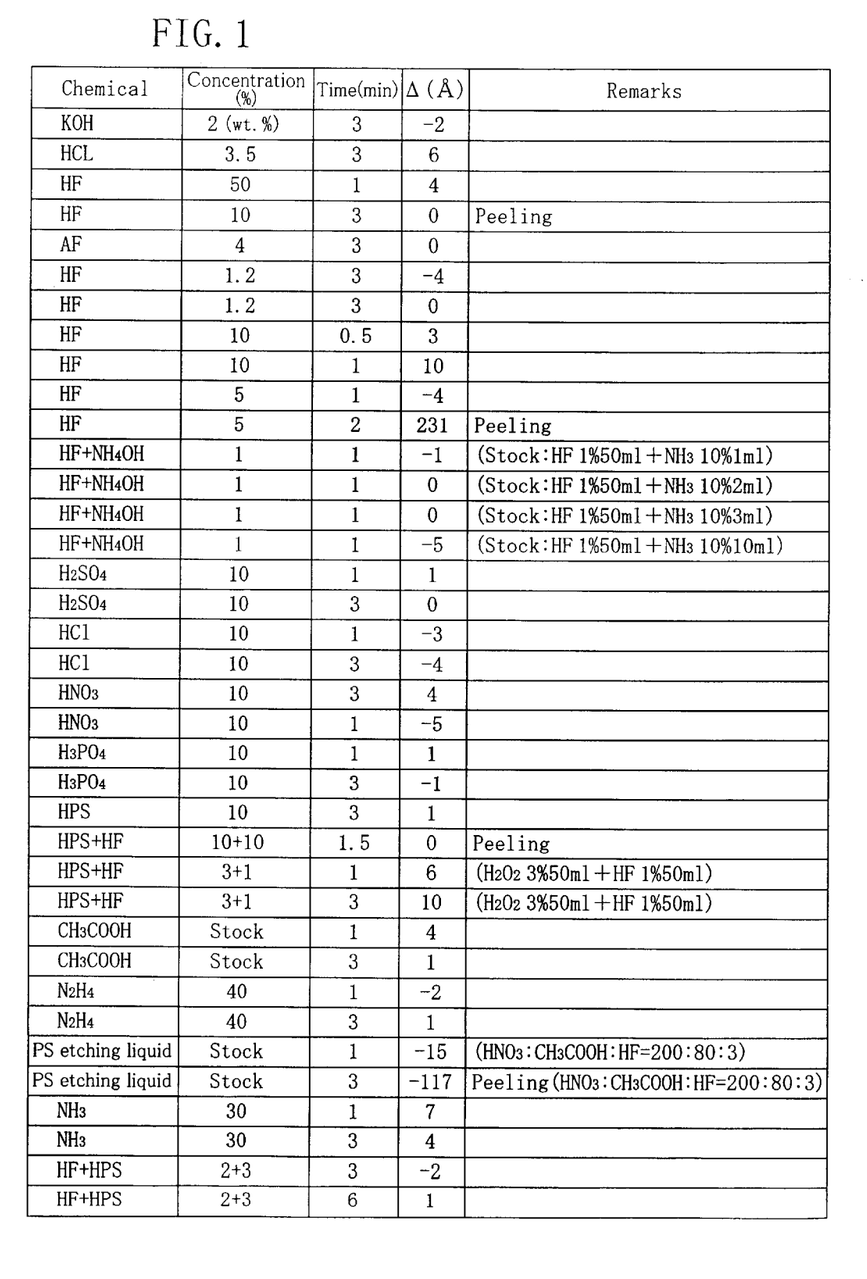
FIG. 1 shows the results of an examination obtained by the present inventors on how the thickness of an annealed $HfO_2$ film changes when immersed in various chemical solutions.

In view of this, the present inventors examined how the thickness of an annealed $HfO_2$ film changes when immersed in various chemical solutions in search for chemical solutions with which an annealed $HfO_2$ film can be removed by wet-etching. The results are shown in FIG. 1, in which "Time" denotes the amount of time for which an $HfO_2$ film is immersed in a chemical solution, and "Δ" denotes the change in the thickness of an $HfO_2$ film. Herein, "Δ" being a negative value means that the thickness of the $HfO_2$ film increased. Chemical solution names "AF", "UPS" and "PS etching liquid" denote "ammonium fluoride", "hydrogen peroxide solution" and "polysilicon etching liquid", respectively. The concentration of each chemical solution is shown in % by volume except for KOH. The concentration of "$HF+NH_4OH$" being 1% means that the stock (undiluted) solution as shown in the remarks column was diluted to 1% by volume with pure water. The mixing ratio of "PS etching liquid" shown in the remarks column is a volume ratio. Finally, "peeling" in the remarks column means that an underlying layer of an $HfO_2$ film was lifted off.

As is apparent from FIG. 1, in addition to DHF solutions, an annealed $HfO_2$ film is not substantially dissolved in any of various chemicals commonly used in semiconductor device manufacturing processes such as hydrogen fluoride (HF) solutions of various concentrations. Thus, it is difficult to remove an annealed $HfO_2$ film by wet-etching with these various chemical solutions. This is believed to be for the following reason. Typically, a metal oxide film such as an $HfO_2$ film transitions from an amorphous state into a monoclinic crystal state by the post-deposition annealing process. Due to this transition, a passive film of $HfO_2$ is formed on the surface of the $HfO_2$ film, whereby it is difficult to remove the $HfO_2$ film by wet-etching.

It is known in the art that a passive film of $HfO_2$ can only be dissolved by a highly oxidative acid such as hot concentrated sulfuric acid. However, it is not practical to use such an acid in a semiconductor device manufacturing process, and it is therefore very difficult to remove an annealed $HfO_2$ film by wet-etching. Thus, it is expected that the complete removal of an $HfO_2$ film will be a significant problem in using an $HfO_2$ film in a transistor. Moreover, it is believed that oxide films of refractory metals, other than $HfO_2$, such as zirconium (Zr), lanthanum (La), tantalum (Ta), aluminum (Al), etc., show a similar tendency.

SUMMARY OF THE INVENTION

The present invention has been made in view of the above, and has an object to make it possible to reliably remove, by wet-etching, an insulative metal oxide film whose surface has been altered through an annealing process, or the like.

The present inventors have conducted a continuous process of trial and error aiming to achieve the object set forth above, and have found that an annealed $HfO_2$ film can be easily removed by wet-etching using a DHF solution, or the like, by exposing the annealed $HfO_2$ film to a plasma before wet-etching the annealed $HfO_2$ film. It is believed that the exposure of an $HfO_2$ film to a plasma gives a plasma damage to a surface portion of the $HfO_2$ film to a depth of about 1 to 3 nm, thereby forming a damaged layer, which is less resistant to wet-etching.

Figure 2:
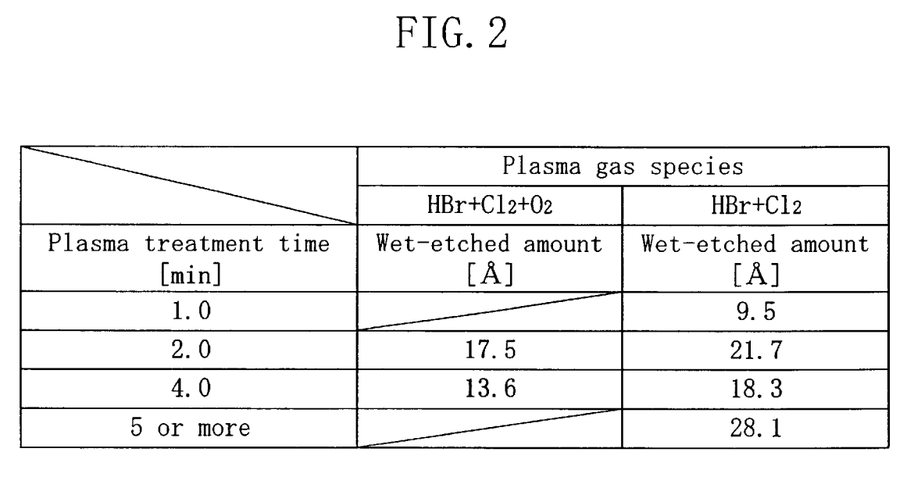
FIG. 2 shows the results of an examination obtained by the present inventors on the plasma treatment time dependence of the amount of an annealed $HfO_2$ film that is wet-etched.

FIG. 2 shows the results of an examination obtained by the present inventors on the plasma treatment time (the amount of time for which a plasma treatment is performed before wet-etching) dependence of the amount of an annealed $HfO_2$ film that is wet-etched with a DHF solution. Herein, a mixed gas of an HBr gas, a $Cl_2$ gas and an $O_2$ gas, and a mixed gas of an HBr gas and a $Cl_2$ gas, were used as plasma gas species. As shown in FIG. 2, the use of either plasma gas species allows an $HfO_2$ film to be wet-etched. In view of this, the present inventors believe that the effect provided by the plasma treatment before wet-etching, i.e., the effect of forming a damaged layer in an annealed $HfO_2$ film, can be obtained irrespective of which plasma gas species is used. Note however that in a case where, for example, an $HfO_2$ film is used as a gate insulating film, and a damaged layer is formed in the $HfO_2$ film (a portion thereof that is located outside a gate electrode) successively after forming the gate electrode by dry-etching, it is preferred to use a plasma gas species with which side-etching of the gate electrode is prevented.

Specifically, a wet-etching method of the present invention, which has been made based on the findings set forth above, includes: a first step of annealing a substrate with a metal oxide film deposited thereon; a second step of exposing a surface of the annealed metal oxide film to a plasma; and a third step of removing, by wet-etching, at least a surface portion of the metal oxide film, which has been exposed to the plasma.

According to the wet-etching method of the present invention, the substrate with the metal oxide film deposited thereon is annealed, and then the surface of the metal oxide film is exposed to a plasma, after which at least a surface portion of the metal oxide film is removed by wet-etching. Specifically, the surface of the metal oxide film, which has been altered through the annealing process to be resistant to wet-etching, is exposed to a plasma. Thus, a damage layer that is less resistant to wet-etching is formed at least in a surface portion of the metal oxide film, Therefore, it is possible to reliably remove, by wet-etching, the damaged layer, i.e., at least the surface portion of the metal oxide film.

Note that since the wet-etchable damaged layer is formed only to a depth of a few nanometers from the surface of the metal oxide film, a portion of the metal oxide film may be left unremoved after wet-etching if the annealed metal oxide film has a large thickness. In other words, the metal oxide film cannot be removed completely. In such a case, it is preferred that the metal oxide film is thinned in advance by etching the metal oxide film with a dry-etching gas, for example, before forming a damaged layer in the metal oxide film through a plasma treatment. In this way, a damaged layer can be formed entirely across the metal oxide film, thereby making it possible to completely remove the metal oxide film by wet-etching. This provides effects such as avoiding the occurrence of a metal contamination due to the metal oxide film residue in the subsequent steps.

In the wet-etching method of the present invention, it is preferred that the second step includes a step of applying a bias power to the substrate.

In this way, ions in the plasma can efficiently reach the substrate, thereby giving a greater plasma damage to the metal oxide film. Thus, it is possible to more easily wet-etch the metal oxide film.

In the wet-etching method of the present invention, it is preferred that the plasma is a plasma made of an HBr-containing gas.

In this way, since an HBr-containing gas has a dry-etching effect on a metal oxide film whose surface has been altered through an annealing process, or the like, it is possible to thin the metal oxide film while forming a damaged layer in the metal oxide film. In this way, a damaged layer can be formed entirely across the metal oxide film, thereby making it possible to completely remove the metal oxide film by wet-etching. Note however that an HBr-containing gas also damages the substrate. Therefore, in a case where the surface of a metal oxide film is exposed to a plasma made of an HBr-containing gas before it is wet-etched, it is preferred to wet-etch the metal oxide film after etching the metal oxide film by the plasma treatment to a certain thickness. In this way, it is possible to remove the metal oxide film by wet-etching while reducing the damage to the substrate.

In the wet-etching method of the present invention, it is preferred that the third step is performed by using a fluorine-containing solution.

In this way, the metal oxide film can be removed reliably through the wet-etching process.

In the wet-etching method of the present invention, the metal oxide film may be an oxide film containing at least one of hafnium, zirconium, lanthanum, tantalum and aluminum.

A first method for manufacturing a semiconductor device of the present invention includes: a first step of annealing a substrate with a metal oxide film deposited thereon; a second step of depositing a conductive film on the annealed metal oxide film; a third step of patterning the conductive film so as to form a gate electrode while exposing a portion of the metal oxide film that is located outside the gate electrode; a fourth step of exposing a surface of the exposed portion of the metal oxide film to a plasma; and a fifth step of removing, by wet-etching, the exposed portion of the metal oxide film, which has been exposed to the plasma.

According to the first method for manufacturing a semiconductor device, the wet-etching method of the present invention is used for removing a portion of the metal oxide film to be a high-k gate insulating film that is located outside the gate electrode, whereby the unnecessary portion of the metal oxide film can be removed completely. Therefore, it is possible to reliably prevent a contamination from occurring due to a metal that is included in the metal oxide film in subsequent steps of the process. Therefore, even when a high-k metal oxide film, instead of a silicon oxide film, is used as a gate insulating film in a conventional MOS process, it is possible to manufacture a reliable semiconductor device with a high yield.

Note that in the first method for manufacturing a semiconductor device, the conductive film to be the gate electrode may be, for example, a layered structure of a metal film and a silicon film. In such a case, the conductive film may be patterned by dry-etching while changing the etching conditions as necessary according to the material to be etched. In a case where a silicon film (polysilicon film) is used in a part or whole of the gate electrode, it is necessary to prevent a side surface of the polysilicon film that is forming the gate electrode from being etched in a plasma treatment for altering the surface of a metal oxide film. Therefore, it is preferred that the gas used in such a surface-altering plasma treatment does not contain oxygen.

Moreover, in the first method for manufacturing a semiconductor device, it is preferred that the third step includes a step of successively plasma-etching the conductive film and the metal oxide film by using a mask pattern that covers a gate electrode formation region so as to thin the portion of the metal oxide film that is located outside the gate electrode.

In this way, the unnecessary portion of the metal oxide film is thinned so that the damaged layer can be formed entirely across the unnecessary portion, whereby the unnecessary portion can be completely removed by wet-etching.

A second method for manufacturing a semiconductor device of the present invention includes: a first step of forming a dummy gate electrode on a substrate; a second step of forming an insulative sidewall on a side surface of the dummy gate electrode; a third step of forming an interlayer insulating film on the substrate, on which the dummy gate electrode and the sidewall have been formed, so that an upper surface of the dummy gate electrode is exposed; a fourth step of removing the dummy gate electrode so as to form a recess in the interlayer insulating film with the sidewall being a wall surface of the recess; a fifth step of depositing a metal oxide film on the interlayer insulating film so that the recess is partly filled; a sixth step of annealing the substrate with the metal oxide film deposited thereon; a seventh step of depositing a conductive film on the annealed metal oxide film so that the recess is completely filled; an eighth step of removing a portion of the conductive film that is located outside the recess so as to form a gate electrode in the recess while exposing a portion of the metal oxide film that is located outside the recess; a ninth step of exposing a surface of the exposed portion of the metal oxide film to a plasma; and a tenth step of removing, by wet-etching, the exposed portion of the metal oxide film, which has been exposed to the plasma.

According to the second method for manufacturing a semiconductor device, the wet-etching method of the present invention is used for removing a portion of the metal oxide film to be a high-k gate insulating film that is located outside the recess for forming the gate electrode therein in a process of forming a replacement-type MIS transistor, whereby the unnecessary portion of the metal oxide film can be completely removed. Thus, it is possible to reliably prevent a contamination from occurring due to a metal that is included in the metal oxide film in subsequent steps of the process. Therefore, even when a high-k metal oxide film, instead of a silicon oxide film, is used as a gate insulating film, it is possible to manufacture a semiconductor device including a reliable replacement-type MIS transistor device with a high yield.

In the second method for manufacturing a semiconductor device, the first step may include a step of forming a dummy gate insulating film between the substrate and the dummy gate electrode, and the fourth step may include a step of removing the dummy gate insulating film.

In the second method for manufacturing a semiconductor device, it is preferred that the ninth step includes a step of plasma-etching the exposed portion of the metal oxide film so as to thin the exposed portion of the metal oxide film.

In this way, the unnecessary portion of the metal oxide film is thinned so that the damaged layer can be formed entirely across the unnecessary portion, whereby the unnecessary portion can be completely removed by wet-etching.

DETAILED DESCRIPTION OF THE INVENTION

First Embodiment

A wet-etching method according to the first embodiment of the present invention will now be described with reference to the drawings.

FIG. 3A to FIG. 3D are cross-sectional views illustrating steps in a wet-etching method of the first embodiment.

Figure 3A:
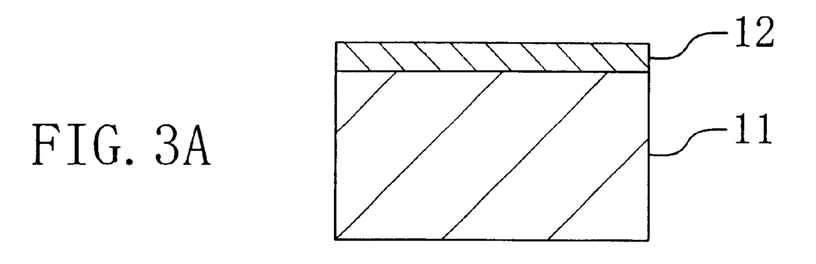
FIG. 3A to FIG. 3D are cross-sectional views illustrating steps in a wet-etching method according to the first embodiment of the present invention.

First, an $HfO_2$ film (as-deposited $HfO_2$ film) 12 is deposited on a silicon substrate 11, as illustrated in FIG. 3A, by using a sputtering deposition apparatus, for example.

Figure 3B:
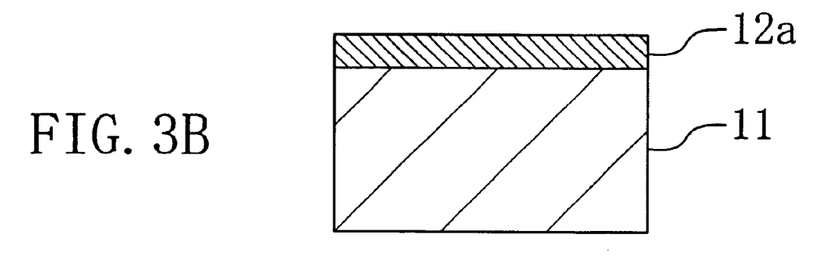

Then, an annealing process, e.g., a rapid thermal nitriding process (RTN process) is performed on the silicon substrate 11. By this process, the as-deposited $HfO_2$ film 12 is altered into a non-wet-etchable $HfO_2$ film (annealed $HfO_2$ film) 12a, as illustrated in FIG. 3B. Herein, the specific annealing conditions are such that the chamber atmosphere is a nitrogen atmosphere, the annealing temperature is 800° C., and the annealing time is 60 seconds.

Figure 3C:
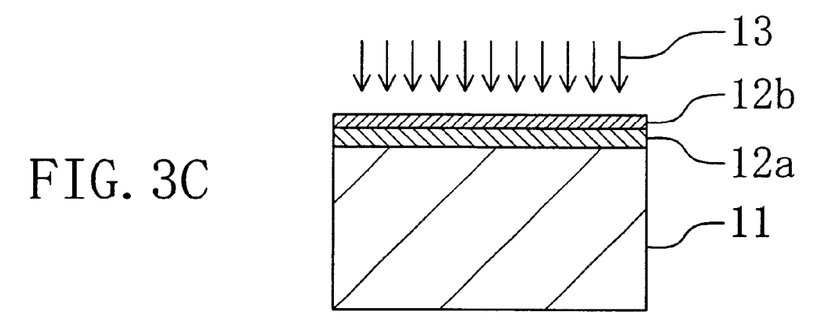

Then, the annealed $HfO_2$ film 12a is exposed to a plasma by using an inductively-coupled plasma (ICP) dry etching apparatus, for example, thereby giving a plasma damage to the surface of the annealed $HfO_2$ film 12a. The specific plasma treatment conditions are such that the plasma gas species is a mixed gas of an HBr gas, a $Cl_2$ gas and an $O_2$ gas (the flow rate ratio is $HBr:Cl_2:O_2=100:15:10$), the total chamber pressure of the dry etching apparatus is 8 Pa, the bias power applied to the silicon substrate 11 is 60 W, and the source power for generating a plasma is 500 W. By performing such a plasma treatment, a wet-etchable damaged layer 12b is formed by ions 13, and the like, in the plasma in a surface portion of the annealed $HfO_2$ film 12a to a depth of about 1 to 3 nm, as illustrated in FIG. 3C.

Figure 3D:
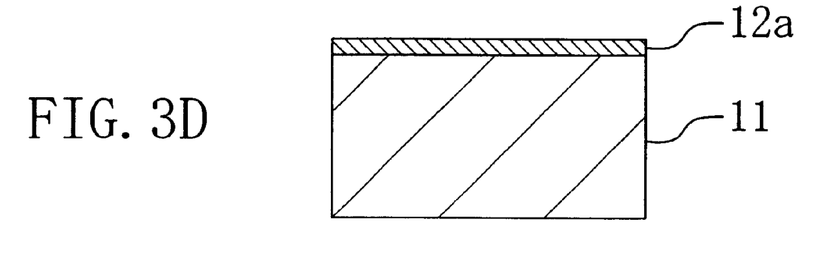

Then, the damaged layer 12b is wet-etched with a dilute hydrogen fluoride (DHF) solution whose hydrofluoric acid concentration is about 1% by mass, for example, thereby removing the damaged layer 12b, i.e., a surface portion of the annealed $HfO_2$ film 12a, as illustrated in FIG. 3D.

According to the first embodiment, the silicon substrate 11 with the $HfO_2$ film 12 deposited thereon is annealed, and the surface of the annealed $HfO_2$ film 12a is exposed to a plasma, after which a surface portion of the annealed $HfO_2$ film 12a is removed by wet-etching. Thus, a surface of the $HfO_2$ film 12a, which has been altered to be resistant to wet-etching through an annealing process, is exposed to a plasma. In this way, the damaged layer 12b, which is less resistant to wet-etching, is formed in a surface portion of the annealed $HfO_2$ film 12a. Therefore, it is possible to reliably remove, by wet-etching, the damaged layer 12b, i.e., a surface portion of the annealed $HfO_2$ film 12a.

Moreover, according to the first embodiment, a bias power is applied to the silicon substrate 11 while the surface of the annealed $HfO_2$ film 12a is exposed to a plasma. In this way, the ions 13 in the plasma can efficiently reach the silicon substrate 11, thereby giving a greater plasma damage to the $HfO_2$ film 12a. Thus, it is possible to more easily wet-etch the $HfO_2$ film 12a.

Note that in the first embodiment, a portion of the annealed $HfO_2$ film 12a remains after the removal of the damaged layer 12b. Specifically, since the wet-etchable damaged layer is formed only to a depth of a few nanometers from the surface of the $HfO_2$ film, a portion of the $HfO_2$ film may be left unremoved after wet-etching if the annealed $HfO_2$ film has a large thickness. In other words, the $HfO_2$ film cannot be removed completely. In such a case, it is preferred that the $HfO_2$ film is thinned in advance by etching the $HfO_2$ film with a dry-etching gas, for example, before forming a damaged layer in the $HfO_2$ film through a plasma treatment. In this way, a damaged layer can be formed entirely across the $HfO_2$ film, thereby making it possible to completely remove the $HfO_2$ film by wet-etching. This provides effects such as avoiding the occurrence of a metal contamination due to the $HfO_2$ film residue in the subsequent steps.

Moreover, while the plasma gas species used in the plasma treatment on the annealed $HfO_2$ film 12a in the first embodiment is not limited to any particular plasma gas species, the following effect can be obtained by using a plasma made of an HBr-containing gas. That is, since an HBr-containing gas has a dry-etching effect on an $HfO_2$ film whose surface has been altered through an annealing process, or the like, it is possible to thin the $HfO_2$ film while forming a damaged layer in the $HfO_2$ film. In this way, a damaged layer can be formed entirely across the $HfO_2$ film, thereby making it possible to completely remove the $HfO_2$ film by wet-etching. Note however that an HBr-containing gas also damages the substrate. Therefore, in a case where the surface of an $HfO_2$ film is exposed to a plasma made of an HBr-containing gas before it is wet-etched, it is preferred to wet-etch the $HfO_2$ film after etching the $HfO_2$ film by the plasma treatment to a certain thickness. In this way, it is possible to remove the $HfO_2$ film by wet-etching while reducing the damage to the substrate.

Moreover, while the chemical solution used in the wet-etching process on the annealed $HfO_2$ film 12a (the damaged layer 12b) in the first embodiment is not limited to any particular chemical solution, the following effect can be obtained by using a fluorine-containing chemical solution. That is, the damaged layer 12b can be removed reliably through the wet-etching process.

Moreover, an $HfO_2$ film is used in the first embodiment as a metal oxide film to be wet-etched, it is not limited to any particular metal oxide film. Specifically, effects as those of the present embodiment can be obtained with an oxide film that contains at least one of hafnium, zirconium, lanthanum, tantalum and aluminum, e.g., a zirconium oxide film, a lanthanum oxide film, a tantalum oxide film, an aluminum oxide film, or the like.

Second Embodiment

A method for manufacturing a semiconductor device according to the second embodiment of the present invention, specifically a method for manufacturing a semiconductor device that includes a metal oxide film such as an $HfO_2$ film as a gate insulating film, will now be described with reference to the drawings. A metal oxide film such as an $HfO_2$ film, having a higher dielectric constant than a silicon oxide film, is expected to be a next-generation gate insulating film that replaces a silicon oxide film. Note that the present embodiment employs the wet-etching method of the present invention (see the first embodiment) for removing a portion of a metal oxide film to be a high-k gate insulating film that is located outside the gate electrode.

FIG. 4A to FIG. 4C and FIG. 5A to FIG. 5C are cross-sectional views illustrating steps in a method for manufacturing a semiconductor device according to the second embodiment.

Figure 4A:
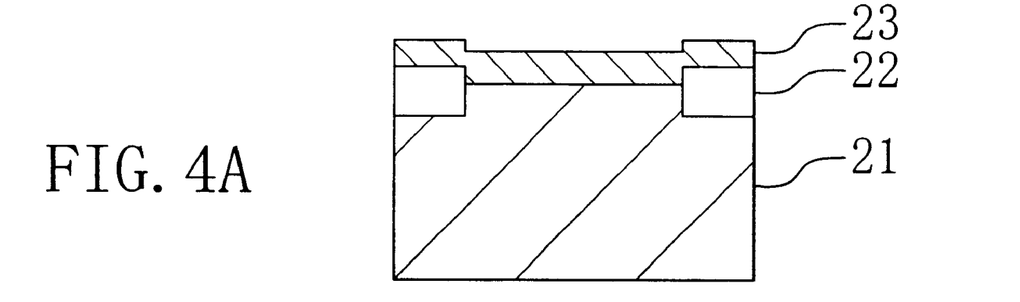
FIG. 4A to FIG. 4C are cross-sectional views illustrating steps in a method for manufacturing a semiconductor device according to the second embodiment of the present invention.

First, an $HfO_2$ film (as-deposited $HfO_2$ film) 23 about 5 nm thick to be a gate insulating film is deposited on a silicon substrate 21, on which an isolation dielectric film 22 has been formed, by a sputtering method, for example, as illustrated in FIG. 4A. Herein, the sputtering conditions are such that the target used is an Hf target, the RF power is 200 W, the chamber pressure is 0.4 kPa, the gas used is a mixed gas of an argon (Ar) gas and an oxygen ($O_2$) gas (both at a flow rate of 10 ml/min (standard state)).

Figure 4B:
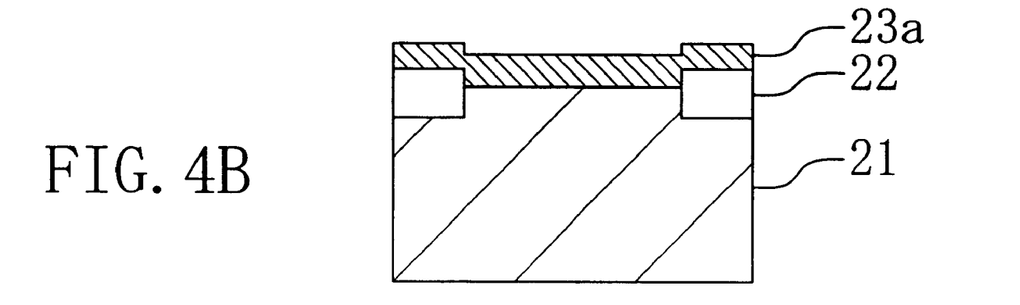

Then, an annealing process, e.g., an RTN process, is performed on the silicon substrate 21. Herein, the specific annealing conditions are such that the annealing temperature is 800° C., the annealing time is 60 seconds. The annealing process is performed for compacting the deposited $HfO_2$ film 23, thereby stabilizing the $HfO_2$ film 23 and improving the electric characteristics thereof. Through the annealing process, the $HfO_2$ film 23 is turned from an amorphous state into a monoclinic crystal state. As a result, the as-deposited $HfO_2$ film 23 is turned into a non-wet-etchable $HfO_2$ film (annealed $HfO_2$ film) 23a, as illustrated in FIG. 4B.

Figure 4C:
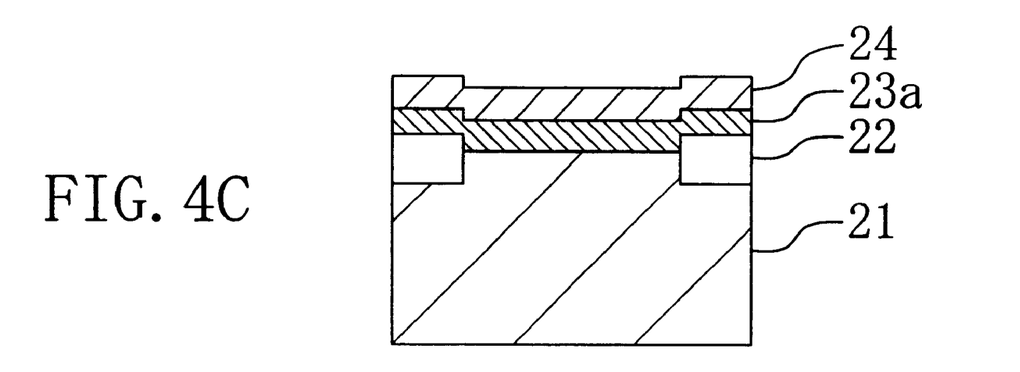
Figure 5A:
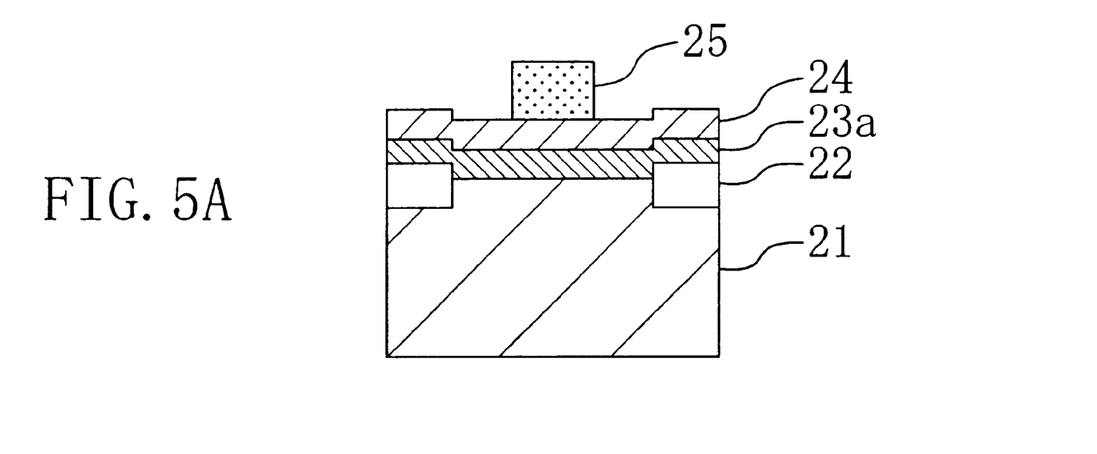
FIG. 5A to FIG. 5C are cross-sectional views illustrating steps in the method for manufacturing a semiconductor device according to the second embodiment of the present invention.

Then, a polysilicon film 24 to be a gate electrode is formed on the annealed $HfO_2$ film 23a, as illustrated in FIG. 4C. Then, a mask pattern 25 is formed on the polysilicon film 24 so as to cover a gate electrode formation region, as illustrated in FIG. 5A. Specifically, a silicon nitride film (not shown) to be the mask pattern 25, i.e., a hard mask, is formed on the polysilicon film 24, and then a resist film (not shown) for patterning the silicon nitride film is applied thereon. Then, the resist film is patterned by a known photolithography method, or the like, and then the silicon nitride film is patterned using the patterned resist film as a mask, thereby forming the mask pattern 25. Then, the resist film is removed by an ashing process.

Figure 5B:
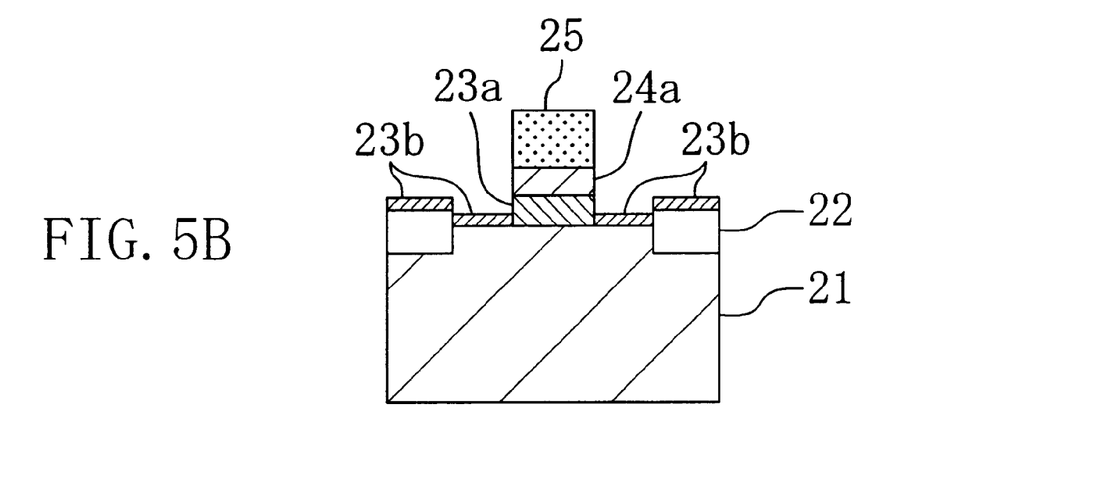

Then, the polysilicon film 24 is dry-etched using the mask pattern 25, as illustrated in FIG. 5B, by using an ICP dry etching apparatus, for example, thereby forming a gate electrode 24a. Herein, the specific dry-etching conditions are such that the plasma species is a mixed gas of an HBr gas and a $Cl_2$ gas (the flow rate ratio is $HBr:Cl_2=100:15$), the total chamber pressure of the dry-etching apparatus is 8 Pa, the bias power applied to the silicon substrate 21 is 60 W, and the source power for generating a plasma is 500 W.

In the present embodiment, a portion of the polysilicon film 24 that is located outside the mask pattern 25 is removed by the dry-etching process as described above so as to expose a portion of the annealed $HfO_2$ film 23a that is located outside the mask pattern 25 (i.e., the gate electrode 24a), and then the exposed portion of the $HfO_2$ film 23a is dry-etched. The dry-etching is stopped when the exposed portion of the annealed $HfO_2$ film 23a, i.e., a portion of the annealed $HfO_2$ film 23a that is located outside the gate electrode 24a, is thinned to a thickness of about 3 nm. In this way, the portion of the annealed $HfO_2$ film 23a that is located outside the gate electrode 24a is entirely damaged by ions, and the like, in the plasma, thereby leaving only a wet-etchable damaged layer 23b on a portion of the silicon substrate 21 that is located outside the gate electrode 24a, as illustrated in FIG. 5B.

Figure 6:
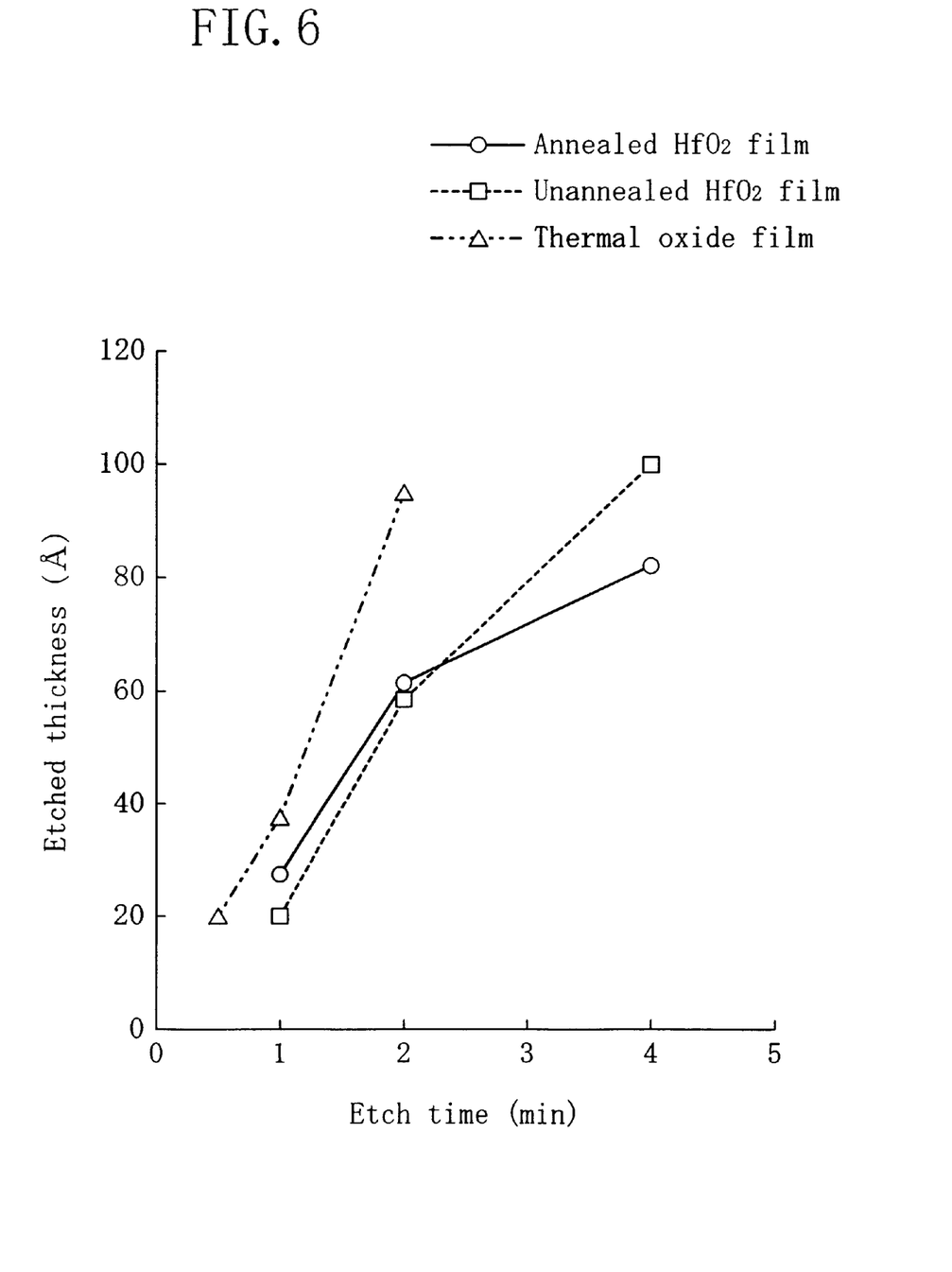
FIG. 6 is a graph illustrating the results of a comparison between the dry-etch rates of an annealed $HfO_2$ film and an unannealed $HfO_2$ film obtained by the present inventors.

Herein, the control of the thickness of an $HfO_2$ film will be described using FIG. 6. FIG. 6 is a graph illustrating the results of a comparison between the dry-etch rates of an annealed $HfO_2$ film and an unannealed $HfO_2$ film (i.e., an as-deposited $HfO_2$ film) obtained by the present inventors. Herein, the comparison results were obtained by using the above-described dry-etching conditions in the step of forming the gate electrode 24a illustrated in FIG. 5B. In FIG. 6, the horizontal axis represents the etching time, and the vertical axis represents the thickness of an $HfO_2$ film that is etched away. For reference, FIG. 6 also shows the dry-etch rate of a thermal oxide film (SiO$_2$ film). As can be seen from the experiment results of FIG. 6, the unannealed HfO$_2$ film (an HfO$_2$ film before being annealed) has a dry-etch rate of about 30 Å/min, and the annealed HfO$_2$ film has a dry-etch rate of about 25 Å/min. Thus, it is shown that the dry-etch rate of the unannealed HfO$_2$ film and that of the annealed HfO$_2$ film are substantially the same, and that it is relatively easy to control the thickness of the annealed HfO$_2$ film by dry-etching. Therefore, dry-etching conditions such that an HfO$_2$ film of a thickness of about 1 to 3 nm is left unremoved on the substrate surface can be determined in advance, whereby it is possible to perform a dry-etching process to leave a damaged layer (HfO$_2$ film) of such a thickness that the damaged layer can be removed by wet-etching in a subsequent step.

Figure 5C:
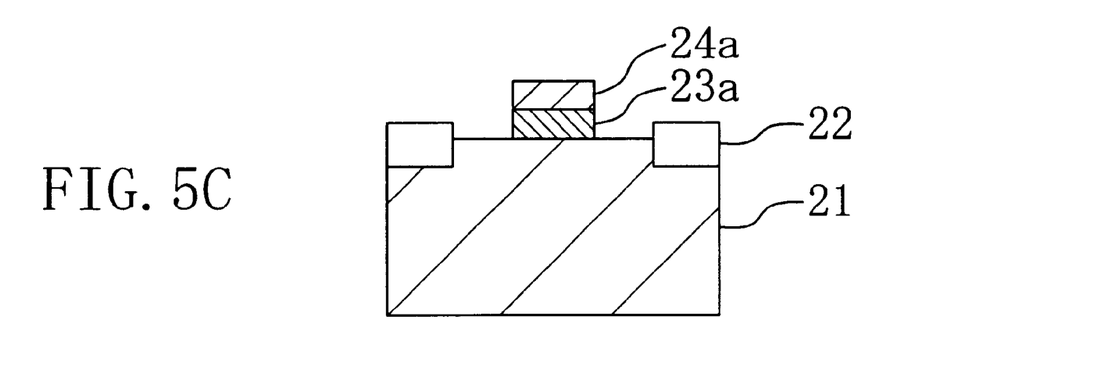

Then, the damaged layer 23b is wet-etched using a dilute hydrogen fluoride (DHF) solution that contains about 1% by weight of hydrogen fluoride, for example, so as to remove the damaged layer 23b (i.e., the exposed portion of the HfO$_2$ film 23a), as illustrated in FIG. 5C. In this way, a portion of the annealed HfO$_2$ film 23a that is located outside the gate electrode 24a can be completely removed by wet-etching, without giving a dry-etching damage to the silicon substrate 21. As a result, a structure in which the gate electrode 24a is formed on the silicon substrate 21, with a high-k gate insulating film made of the annealed HfO$_2$ film 23a interposed between the gate electrode 24 and the silicon substrate 21. Note that the mask pattern 25 may be removed either before or after the wet-etching step shown in FIG. 5C.

Then, although not shown, a transistor is formed by a common MOS transistor manufacturing process known in the prior art. Specifically, an impurity diffusion layer as an extension to be a source region and a drain region is formed by an ion implantation technique, and then a gate sidewall insulating film made of a silicon nitride film, or the like, is formed. Then, a high concentration impurity diffusion layer to be a source region and a drain region is formed, and then a salicide process, an interlayer insulating film formation process, etc., are performed.

As described above, according to the second embodiment, the silicon substrate 21 with the HfO$_2$ film 23 deposited thereon is annealed, and then the polysilicon film 24 is formed on the annealed HfO$_2$ film 23a. Then, the polysilicon film 24 is patterned to form the gate electrode 24a and to expose a portion of the HfO$_2$ film 23a that is located outside the gate electrode 24a. Then, the surface of the exposed portion of the HfO$_2$ film 23a is exposed to a plasma, and then the exposed portion is removed by wet-etching. Thus, the second embodiment employs the wet-etching method of the present invention for removing a portion of the HfO$_2$ film 23a to be a high-k gate insulating film that is located outside the gate electrode 24a, whereby an unnecessary portion of the HfO$_2$ film 23a can be removed completely. Therefore, it is possible to reliably prevent a contamination from occurring due to a metal (Hf) that is included in the HfO$_2$ film 23a in subsequent steps of the process. Therefore, even when an HfO$_2$ film, i.e., a high-k metal oxide film, instead of a silicon oxide film, is used as a gate insulating film in a conventional MOS process, it is possible to manufacture a reliable semiconductor device with a high yield.

Moreover, according to the second embodiment, when a portion of the HfO$_2$ film 23a that is located outside the gate electrode 24a is exposed to a plasma, the polysilicon film 24 and the HfO$_2$ film 23a are successively plasma-etched using the mask pattern 25 that covers a gate electrode formation region, thereby thinning the portion of the HfO$_2$ film 23a that is located outside the gate electrode 24a. Thus, the portion of the HfO$_2$ film 23a that is located outside the gate electrode 24a, i.e., the unnecessary portion of the HfO$_2$ film 23a, is thinned so that the damaged layer 23b can be formed entirely across the unnecessary portion, whereby the unnecessary portion can be completely removed by wet-etching.

Note that while a sputtering method is used for depositing the HfO$_2$ film 23 in the second embodiment, any other suitable method, such as a CVD method, may alternatively be used therefor. The CVD method used in the present invention may be a common thermal CVD method, or an ALD (Atomic Layer Deposition) method in which a source gas is supplied in a pulsed manner so as to deposit a high-k layer (HfO$_2$ film) one atomic layer at a time.

Moreover, the type of a conductive film to be the gate electrode in the second embodiment is not limited to any particular type. The conductive film to be the gate electrode may be, for example, a layered structure of a metal film and a silicon film. In such a case, the conductive film may be patterned by dry-etching while changing the etching conditions as necessary according to the material to be etched. Note however that in a case where a silicon film (polysilicon film) is used in a part or whole of the gate electrode, it is necessary to prevent a side surface of the polysilicon film that is forming the gate electrode from being etched in a plasma treatment for altering the surface of a metal oxide film (an HfO$_2$ film in the present embodiment). Therefore, it is preferred that the gas used in such a surface-altering plasma treatment does not contain oxygen.

Specifically, in the second embodiment, an oxygen gas is not used in the dry-etching step illustrated in FIG. 5B so that the polysilicon film 24 to be the gate electrode 24a is not side-etched. In a plasma treatment for forming a damaged layer in a metal oxide film, any of various types of gases may be used, including, for example, gases that do not particularly have an etching effect. However, if the etching gas contains an oxygen gas in a case where a polysilicon film is formed on a metal oxide film, a plasma made of the oxygen gas may possibly etch the polysilicon film from the side surface thereof Therefore, in a plasma treatment (which, in the present embodiment, includes an etching process) on a metal oxide film (an HfO$_2$ film in the present embodiment), it is preferred that an oxygen gas is not used so as to prevent the polysilicon film from being side-etched. In view of this, the step of etching the polysilicon film to be the gate electrode and the step of etching the HfO$_2$ film may be performed under different etching conditions.

Moreover, while the plasma gas species used in the plasma treatment on the annealed HfO$_2$ film 23a in the second embodiment is not limited to any particular plasma gas species, the following effect can be obtained by using a plasma made of an HBr-containing gas. That is, since an HBr-containing gas has a dry-etching effect on an HfO$_2$ film whose surface has been altered through an annealing process, or the like, it is possible to thin the HfO$_2$ film while forming a damaged layer in the HfO$_2$ film. In this way, a damaged layer can be formed entirely across the HfO$_2$ film, thereby making it possible to completely remove the HfO$_2$ film by wet-etching. Note however that an HBr-containing gas also damages the substrate. Therefore, in a case where the surface of an HfO$_2$ film is exposed to a plasma made of an HBr-containing gas before it is wet-etched, it is preferred to wet-etch the HfO$_2$ film after etching the HfO$_2$ film by the plasma treatment to a certain thickness. In this way, it is possible to remove the HfO$_2$ film by wet-etching while reducing the damage to the substrate.

Moreover, while the chemical solution used in the wet-etching process on the annealed HfO$_2$ film 23a (the damaged layer 23b) in the second embodiment is not limited to any particular chemical solution, the following effect can be obtained by using a fluorine-containing chemical solution. That is, the damaged layer 23b can be removed reliably through the wet-etching process.

Moreover, an $HfO_2$ film is used in the second embodiment as a gate insulating film, it is not limited to any particular metal oxide film. Specifically, effects as those of the present embodiment can be obtained with an oxide film that contains at least one of hafnium, zirconium, lanthanum, tantalum and aluminum, e.g., a zirconium oxide film, a lanthanum oxide film, a tantalum oxide film, an aluminum oxide film, or the like.

Third Embodiment

A method for manufacturing a semiconductor device according to the third embodiment of the present invention, specifically a method for manufacturing a replacement-type transistor including a metal oxide film such as an $HfO_2$ film as a gate insulating film by using the wet-etching method of the present invention (see the first embodiment), will now be described with reference to the drawings.

FIG. 7A to FIG. 7D and FIG. 8A to FIG. 8C are cross-sectional views illustrating steps in a method for manufacturing a semiconductor device according to the third embodiment.

Figure 7A:
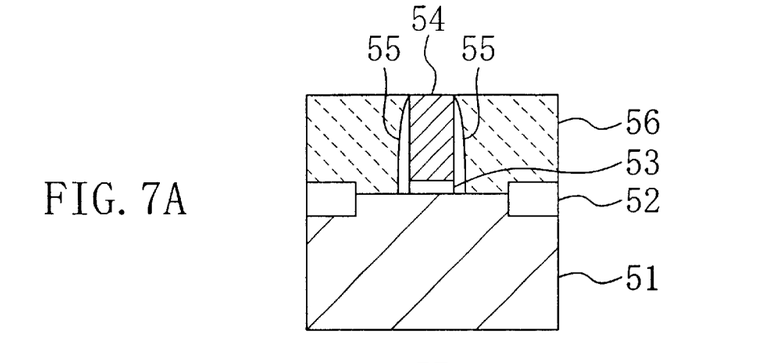
FIG. 7A to FIG. 7D are cross-sectional views illustrating steps in a method for manufacturing a semiconductor device according to the third embodiment of the present invention.

First, an isolation dielectric film 52 having an STI (shallow trench isolation) structure, for example, is formed on a silicon substrate 51, as illustrated in FIG. 7A. Then, a dummy gate insulating film 53 (to be removed eventually) made of a silicon oxide film having a thickness of about 1 to 5 nm, for example, is formed on the silicon substrate 51. Then, a dummy gate electrode 54 (to be removed eventually) made of a polysilicon film having a thickness of about 150 nm, for example, is formed on the dummy gate insulating film 53. The dummy gate insulating film 53 and the dummy gate electrode 54 may be formed by using any of various film deposition methods such as an oxidation method or a CVD method, a photolithography technique, an etching technique, etc., which are used in common semiconductor processes. Then, a ion implantation process is performed on the silicon substrate 51 using the dummy gate electrode 54 as a mask, thereby forming an impurity diffusion layer (not shown) as an extension to be a source region and a drain region. Then, by using a CVD method and a dry-etching method, a gate sidewall insulating film (sidewall) 55 having a width of about 20 to 40 nm and made of a silicon oxide film, for example, is formed on the side surface of the dummy gate electrode 54. Then, an ion implantation process is performed on a silicon substrate 51 using the dummy gate electrode 54 and the gate sidewall insulating film 55 as a mask, thereby forming a high concentration impurity diffusion layer (not shown) to be a source region and a drain region. Furthermore, a cobalt silicide film (not shown) having a thickness of about 40 nm, for example, is formed only on each of the source region and the drain region by using a salicide process technique with the dummy gate electrode 54 being a mask. Then, an interlayer insulating film 56 made of a silicon oxide film, or the like, is deposited by using a CVD method, for example, on the upper surface of the silicon substrate 51, including the upper surface of the dummy gate electrode 54, etc., and then the interlayer insulating film 56 is flattened by using a chemical mechanical polishing (CMP) method, for example, so that the upper surface of the dummy gate electrode 54 is exposed.

Figure 7B:
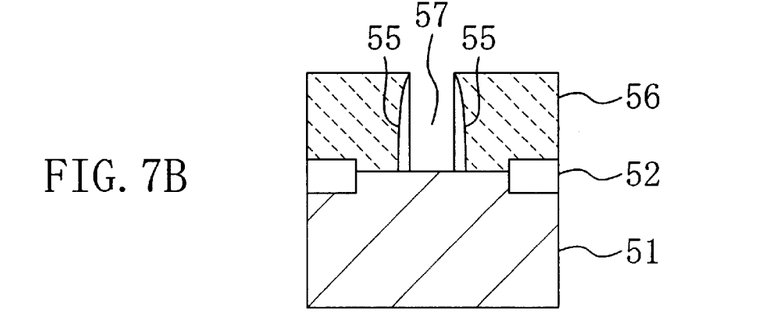

Then, the dummy gate electrode 54 is removed selectively with respect to the interlayer insulating film 56 and the gate sidewall insulating film 55 by using a gas containing halogen atoms such as HBr, for example, as illustrated in FIG. 7B. Furthermore, the dummy gate insulating film 53 is removed by wet-etching using, for example, a dilute hydrogen fluoride solution, or the like. Thus, a recess (a groove for forming a gate electrode therein) 57 is formed in the interlayer insulating film 56 with the gate sidewall insulating film 55 being the wall surface of the recess 57.

Figure 7C:
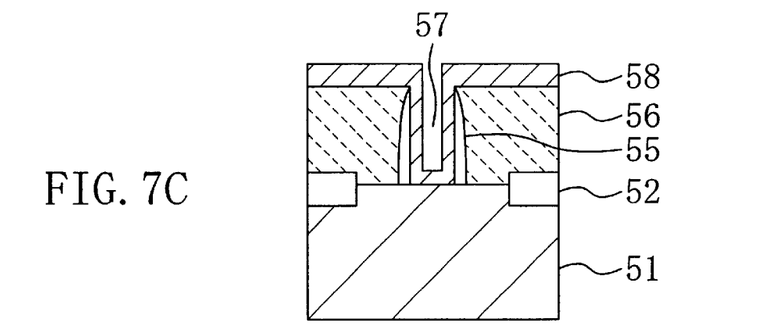

Then, an $HfO_2$ film (as deposited $HfO_2$ film) 58 about 5 nm thick to be a gate insulating film is formed on the interlayer insulating film 56 by using a sputtering method or a CVD method, for example, as illustrated in FIG. 7C. Thus, the recess 57 is partly filled with the $HfO_2$ film 58.

Figure 7D:
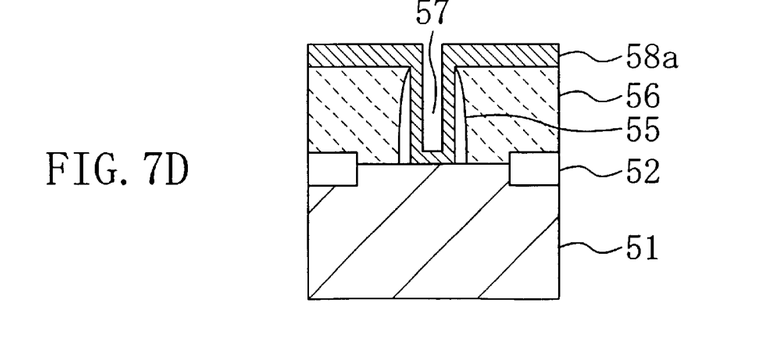

Then, an annealing process, e.g., an RTN process, is performed on the silicon substrate 51. Herein, the specific annealing conditions are such that the chamber atmosphere is a nitrogen atmosphere, the annealing temperature is 800° C., and the annealing time is 60 seconds. Through the annealing process, the $HfO_2$ film (as-deposited $HfO_2$ film) 58 is turned into a non-wet-etchable $HfO_2$ film (annealed $HfO_2$ film) 58a, as illustrated in FIG. 7D.

Note that while the above-described steps shown in FIG. 7A to FIG. 7D are performed for both of an N-type MIS transistor formation region and a P-type MIS transistor formation region in the present embodiment, only one of the transistor formation regions is shown in these figures, with the other transistor formation region being omitted.

Figure 8A:
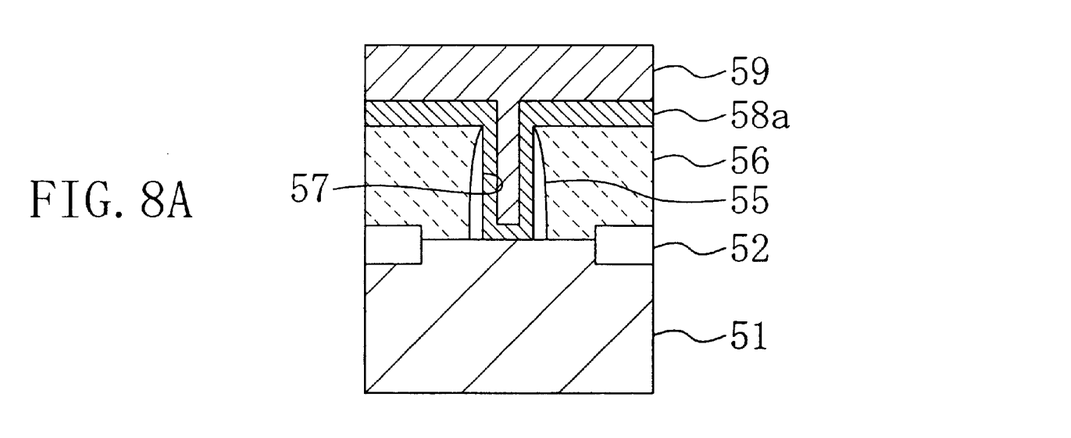
FIG. 8A to FIG. 8C are cross-sectional views illustrating steps in the method for manufacturing a semiconductor device according to the third embodiment of the present invention.

Then, a tungsten film 59 to be a gate electrode is deposited on the annealed $HfO_2$ film 58a by using, for example, a CVD method, or the like, so as to completely fill the recess 57, as illustrated in FIG. 8A.

Figure 8B:
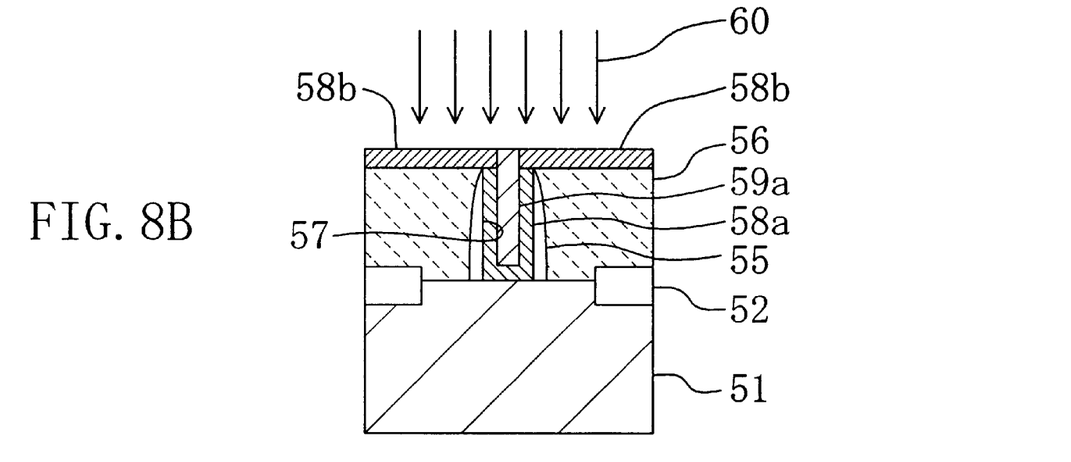

Then, a portion of the tungsten film 59 that is located outside the recess 57 is removed by using, for example, a CMP technique or a dry-etching technique, thereby forming a gate electrode 59a in the recess 57, as illustrated in FIG. 8B. Thus, a portion of the $HfO_2$ film 58a that is located outside the recess 57 is exposed. Then, a plasma dry-etching process is performed on the exposed portion of the $HfO_2$ film 58a, thereby thinning the exposed portion to a thickness of about 3 nm. In this process, a bias power is applied to the silicon substrate 51, whereby the entire exposed portion of the $HfO_2$ film 58a is damaged by ions 60, and the like, in the plasma. As a result, only a wet-etchable damaged layer 58b is left on a portion of the interlayer insulating film 56 that is located outside the recess 57, as illustrated in FIG. 8B.

Figure 8C:
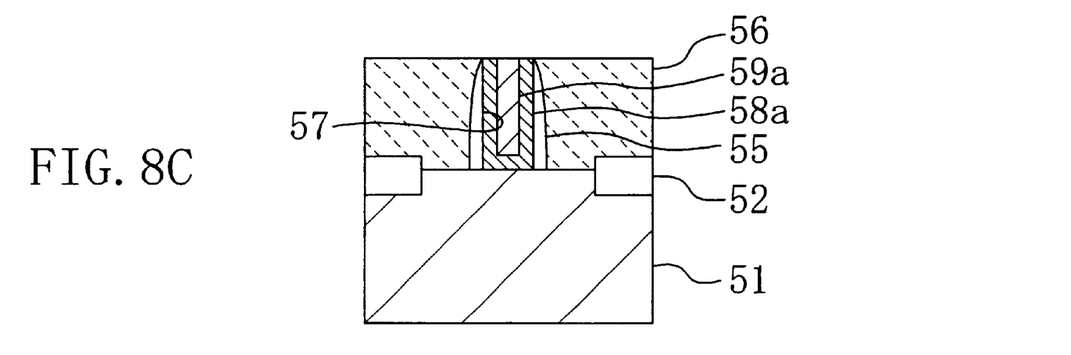

Then, the damaged layer 58b is wet-etched using a dilute hydrogen fluoride (DHF) solution that contains about 1% by weight of hydrogen fluoride, for example, so as to remove the damaged layer 58b (i.e., the exposed portion of the $HfO_2$ film 58a), as illustrated in FIG. 8C. In this way, a portion of the $HfO_2$ film 58a that is located outside the recess 57 can be completely removed by wet-etching, without causing a metal contamination due to Hf, which may occur in a case where the $HfO_2$ film is removed by a CMP method, for example. As a result, a replacement-type transistor structure in which the gate electrode 59a is formed in the recess 57, with a high-k gate insulating film made of the $HfO_2$ film 58a interposed between the gate electrode 59a and the wall surface of the recess 57, is provided.

As described above, according to the third embodiment, the dummy gate electrode 54 is formed on the silicon substrate 51, with the dummy gate insulating film 53 interposed between the dummy gate electrode 54 and the silicon substrate 51, and then the gate sidewall insulating film 55 is formed on the side surface of the dummy gate electrode 54, after which the interlayer insulating film 56 is formed on the silicon substrate 51 so that the upper surface of the dummy gate electrode 54 is exposed. Then, the dummy gate electrode 54 and the dummy gate insulating film 53 are removed, thereby forming the recess 57 in the interlayer insulating film 56 with the gate sidewall insulating film 55 being the wall surface of the recess 57, after which the HfO$_2$ film 58 is deposited on the interlayer insulating film 56 so that the recess 57 is partly filled. Then, the silicon substrate 51 with the HfO$_2$ film 58 deposited thereon is annealed, and then the tungsten film 59 is deposited on the annealed HfO$_2$ film 58a so as to completely fill the recess 57. Then, a portion of the tungsten film 59 that is located outside the recess 57 is removed, thereby forming the gate electrode 59a in the recess 57 while exposing a portion of the HfO$_2$ film 58a that is located outside the recess 57. Then, the surface of the exposed portion of the HfO$_2$ film 58a is exposed to a plasma, and then the exposed portion is removed by wet-etching. Thus, the third embodiment employs the wet-etching method of the present invention for removing a portion of the HfO$_2$ film 58a to be a high-k gate insulating film that is located outside the recess 57 (a recess for forming a gate electrode therein) in a process of forming a replacement-type MIS transistor, whereby the unnecessary portion of the HfO$_2$ film 58a can be completely removed. Specifically, it is possible to reliably prevent a metal contamination due to Hf, which may occur in a case where the HfO$_2$ film is removed by a CMP method. Thus, it is possible to reliably prevent a contamination from occurring due to a metal that is included in the HfO$_2$ film 58a in subsequent steps of the process. Therefore, even when an HfO$_2$ film, i.e., a high-k metal oxide film, instead of a silicon oxide film, is used as a gate insulating film, it is possible to manufacture a semiconductor device including a reliable replacement-type MIS transistor device with a high yield.

Moreover, according to the third embodiment, when a portion of the HfO$_2$ film 58a that is located outside the recess 57, i.e., the exposed portion of the HfO$_2$ film 58a, is exposed to a plasma, the exposed portion is plasma-etched, thereby thinning the exposed portion. Thus, the exposed portion of the HfO$_2$ film 58a, i.e., the unnecessary portion of the HfO$_2$ film 58a, is thinned so that the damaged layer 58b can be formed entirely across the unnecessary portion, whereby the unnecessary portion can be completely removed by wet-etching.

Note that the method for depositing the HfO$_2$ film 58 in the third embodiment is not limited to any particular method.

Moreover, the type of a conductive film to be the gate electrode in the third embodiment is not limited to any particular type.

Moreover, while the plasma gas species used in the plasma treatment (a plasma dry-etching process in the present embodiment) on the annealed HfO$_2$ film 58a in the third embodiment is not limited to any particular plasma gas species, the following effect can be obtained by using a plasma made of an HBr-containing gas. That is, since an HBr-containing gas has a dry-etching effect on an HfO$_2$ film whose surface has been altered through an annealing process, or the like, it is possible to thin the HfO$_2$ film while forming a damaged layer in the HfO$_2$ film. In this way, a damaged layer can be formed entirely across the HfO$_2$ film, thereby making it possible to completely remove the HfO$_2$ film by wet-etching. Note however that an HBr-containing gas also damages the substrate. Therefore, in a case where the surface of an HfO$_2$ film is exposed to a plasma made of an HBr-containing gas before it is wet-etched, it is preferred to wet-etch the HfO$_2$ film after etching the HfO$_2$ film by the plasma treatment to a certain thickness. In this way, it is possible to remove the HfO$_2$ film by wet-etching while reducing the damage to the substrate.

Moreover, while the chemical solution used in the wet-etching process on the annealed HfO$_2$ film 58a (the damaged layer 58b) in the third embodiment is not limited to any particular chemical solution, the following effect can be obtained by using a fluorine-containing chemical solution. That is, the damaged layer 58b can be removed reliably through the wet-etching process.

Moreover, an HfO$_2$ film is used in the third embodiment as a gate insulating film, it is not limited to any particular metal oxide film. Specifically, effects as those of the present embodiment can be obtained with an oxide film that contains at least one of hafnium, zirconium, lanthanum, tantalum and aluminum, e.g., a zirconium oxide film, a lanthanum oxide film, a tantalum oxide film, an aluminum oxide film, or the like.

What is claimed is:

1. A wet-etching method, comprising:
   a first step of annealing a substrate with a metal oxide film deposited thereon;
   a second step of exposing a surface of the annealed metal oxide film to a plasma; and
   a third step of removing, by wet-etching, at least a surface portion of the metal oxide film, which has been exposed to the plasma.

2. The wet-etching method of claim 1, wherein the second step includes a step of applying a bias power to the substrate.

3. The wet-etching method of claim 1, wherein the plasma is a plasma made of an HBr-containing gas.

4. The wet-etching method of claim 1, wherein the third step is performed by using a fluorine-containing solution.

5. The wet-etching method of claim 1, wherein the metal oxide film is an oxide film containing at least one of hafnium, zirconium, lanthanum, tantalum and aluminum.

6. A method for manufacturing a semiconductor device, comprising:
   a first step of annealing a substrate with a metal oxide film deposited thereon;
   a second step of depositing a conductive film on the annealed metal oxide film;
   a third step of patterning the conductive film so as to form a gate electrode while exposing a portion of the metal oxide film that is located outside the gate electrode;
   a fourth step of exposing a surface of the exposed portion of the metal oxide film to a plasma; and
   a fifth step of removing, by wet-etching, the exposed portion of the metal oxide film, which has been exposed to the plasma.

7. The method for manufacturing a semiconductor device of claim 6, wherein the third step includes a step of successively plasma-etching the conductive film and the metal oxide film by using a mask pattern that covers a gate electrode formation region so as to thin the portion of the metal oxide film that is located outside the gate electrode.

8. A method for manufacturing a semiconductor device, comprising:
   a first step of forming a dummy gate electrode on a substrate;
   a second step of forming an insulative sidewall on a side surface of the dummy gate electrode;
   a third step of forming an interlayer insulating film on the substrate, on which the dummy gate electrode and the sidewall have been formed, so that an upper surface of the dummy gate electrode is exposed;

a fourth step of removing the dummy gate electrode so as to form a recess in the interlayer insulating film with the sidewall being a wall surface of the recess;

a fifth step of depositing a metal oxide film on the interlayer insulating film so that the recess is partly filled;

a sixth step of annealing the substrate with the metal oxide film deposited thereon;

a seventh step of depositing a conductive film on the annealed metal oxide film so that the recess is completely filled;

an eighth step of removing a portion of the conductive film that is located outside the recess so as to form a gate electrode in the recess while exposing a portion of the metal oxide film that is located outside the recess;

a ninth step of exposing a surface of the exposed portion of the metal oxide film to a plasma; and a tenth step of removing, by wet-etching, the exposed portion of the metal oxide film, which has been exposed to the plasma.

9. The method for manufacturing a semiconductor device of claim 8, wherein:

the first step includes a step of forming a dummy gate insulating film between the substrate and the dummy gate electrode; and the fourth step includes a step of removing the dummy gate insulating film.

10. The method for manufacturing a semiconductor device of claim 8, wherein the ninth step includes a step of plasma-etching the exposed portion of the metal oxide film so as to thin the exposed portion of the metal oxide film.

* * * * *